US010584970B2

(12) United States Patent
Klipp et al.

(10) Patent No.: US 10,584,970 B2
(45) Date of Patent: Mar. 10, 2020

(54) LOCALIZATION APPARATUS AND LOCALIZATION METHOD

(71) Applicant: Fraunhofer-Gesellschaft zur Förderung der angewandten Forschung e.V., München (DE)

(72) Inventors: Konstantin Klipp, Berlin (DE); Jonas Willaredt, Berlin (DE); Helge Rosé, Berlin (DE); Ilja Radusch, Berlin (DE)

(73) Assignee: Fraunhofer-Gesellschaft zur Förderung der angewandten Forschung e.V., München (DE)

( * ) Notice: Subject to any disclaimer, the term of this patent is extended or adjusted under 35 U.S.C. 154(b) by 71 days.

(21) Appl. No.: 15/543,403

(22) PCT Filed: Jan. 15, 2016

(86) PCT No.: PCT/EP2016/050817
§ 371 (c)(1),
(2) Date: Jul. 13, 2017

(87) PCT Pub. No.: WO2016/113411
PCT Pub. Date: Jul. 21, 2016

(65) Prior Publication Data
US 2017/0356744 A1    Dec. 14, 2017

(30) Foreign Application Priority Data

Jan. 15, 2015   (DE) .................. 10 2015 100 591
Mar. 20, 2015   (DE) .................. 10 2015 205 097

(51) Int. Cl.
*G01C 21/20*   (2006.01)
*G01R 33/24*   (2006.01)
(Continued)

(52) U.S. Cl.
CPC ......... *G01C 21/206* (2013.01); *G01R 33/246* (2013.01); *G06T 7/20* (2013.01); *G01S 13/02* (2013.01)

(58) Field of Classification Search
CPC ...... G01C 21/206; G06T 7/20; G01R 33/246; G01S 13/02
See application file for complete search history.

(56) References Cited

U.S. PATENT DOCUMENTS 6,546,336 B1   4/2003   Matsuoka et al.
8,683,707 B1   4/2014   Horton, Jr.
(Continued)

FOREIGN PATENT DOCUMENTS

DE   19946212 A1   4/2000
EP   2602590 A1    6/2013
WO   2014172792 A1  10/2014

OTHER PUBLICATIONS

Chirakkal et al.; "An Efficient and Simple Approach for Indoor Navigation Using Smart Phone and QR Code"; The 18th IEEE International Symposium on Consumer Electronics (ISCE 2014); 2014; pp. 1-2.
(Continued)

*Primary Examiner* — Yuen Wong
(74) *Attorney, Agent, or Firm* — The Webb Law Firm

(57) ABSTRACT

A localization apparatus, the position of which in a localization space is determinable including a movement sensor system having at least one translation sensor and at least one rotation sensor for capturing movement variables that act on the localization apparatus and at least one magnetometer apparatus for capturing magnetic field data in the localization space. Rotationally invariant magnetic features are determinable by means of an internal or external data processing apparatus. A means for determining an absolute position of the localization apparatus in the localization
(Continued)

space and the integrated data processing apparatus or a coupling to the external data processing apparatus for calculating a position while processing the measurement data of the movement sensor system using a magnetic field map that was stored in advance, having magnetic parameters of at least parts of the localization space and for processing the determined absolute position are included.

23 Claims, 4 Drawing Sheets

(51) Int. Cl.
  *G06T 7/20* (2017.01)
  *G01S 13/02* (2006.01)

(56) References Cited

U.S. PATENT DOCUMENTS

| | | | |
|---|---|---|---|
| 2007/0197229 A1* | 8/2007 | Kalliola | H04W 4/029 455/456.1 |
| 2010/0042322 A1 | 2/2010 | Won | |
| 2011/0054836 A1* | 3/2011 | Foxlin | G01C 21/165 702/150 |
| 2013/0057260 A1* | 3/2013 | Kim | G01R 33/0064 324/207.11 |
| 2013/0179074 A1 | 7/2013 | Haverinen | |
| 2013/0311084 A1 | 11/2013 | Lundquist et al. | |
| 2014/0149033 A1 | 5/2014 | Moosavi et al. | |
| 2014/0357305 A1 | 12/2014 | Haverinen et al. | |
| 2015/0350849 A1* | 12/2015 | Huang | H04W 4/04 455/456.1 |

OTHER PUBLICATIONS

Feliz et al.; "Pedestrian tracking using inertial sensors"; Journal of Physical Agents; 2009; pp. 35-42; vol. 3:1.

Foxlin; "Pedestrian Tracking with Shoe-Mounted Inertial Sensors"; IEEE Computer Graphics and Applications; 2005; pp. 38-46; vol. 25:6.

Kim et al.; "Indoor Positioning System Using Geomagnetic Anomalies for Smartphones"; 2012 International Conference on Indoor Positioning and Indoor Navigation; 2012; pp. 1-5.

Madgwick et al.; "Estimation of IMU and MARG orientation using a gradient descent algorithm"; 2011 IEEE International Conference on Rehabilitation Robotics; 2011; pp. 179-185.

* cited by examiner

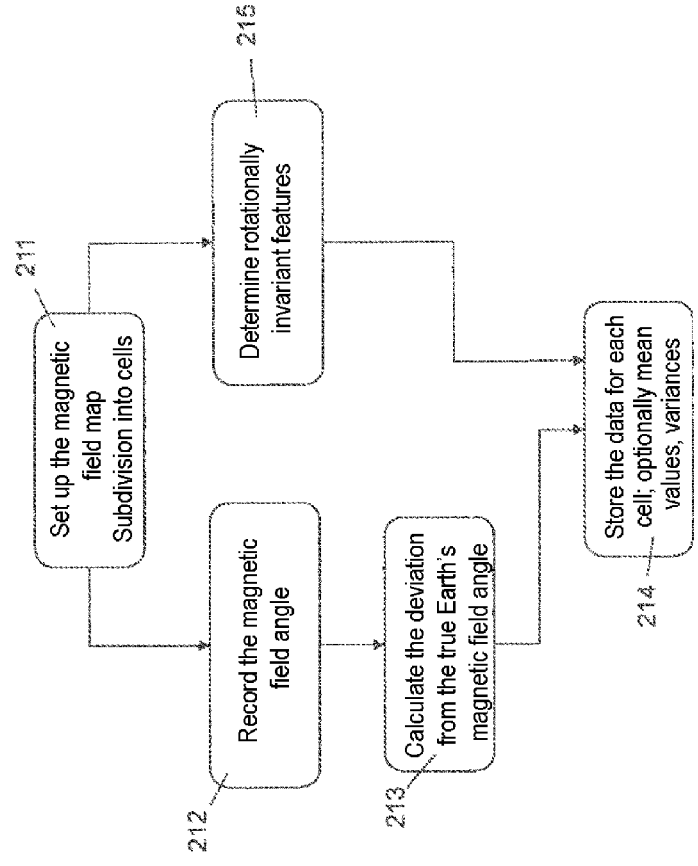
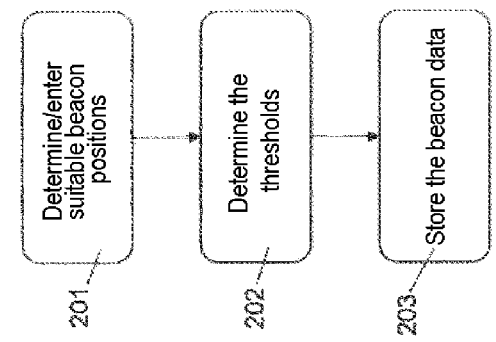

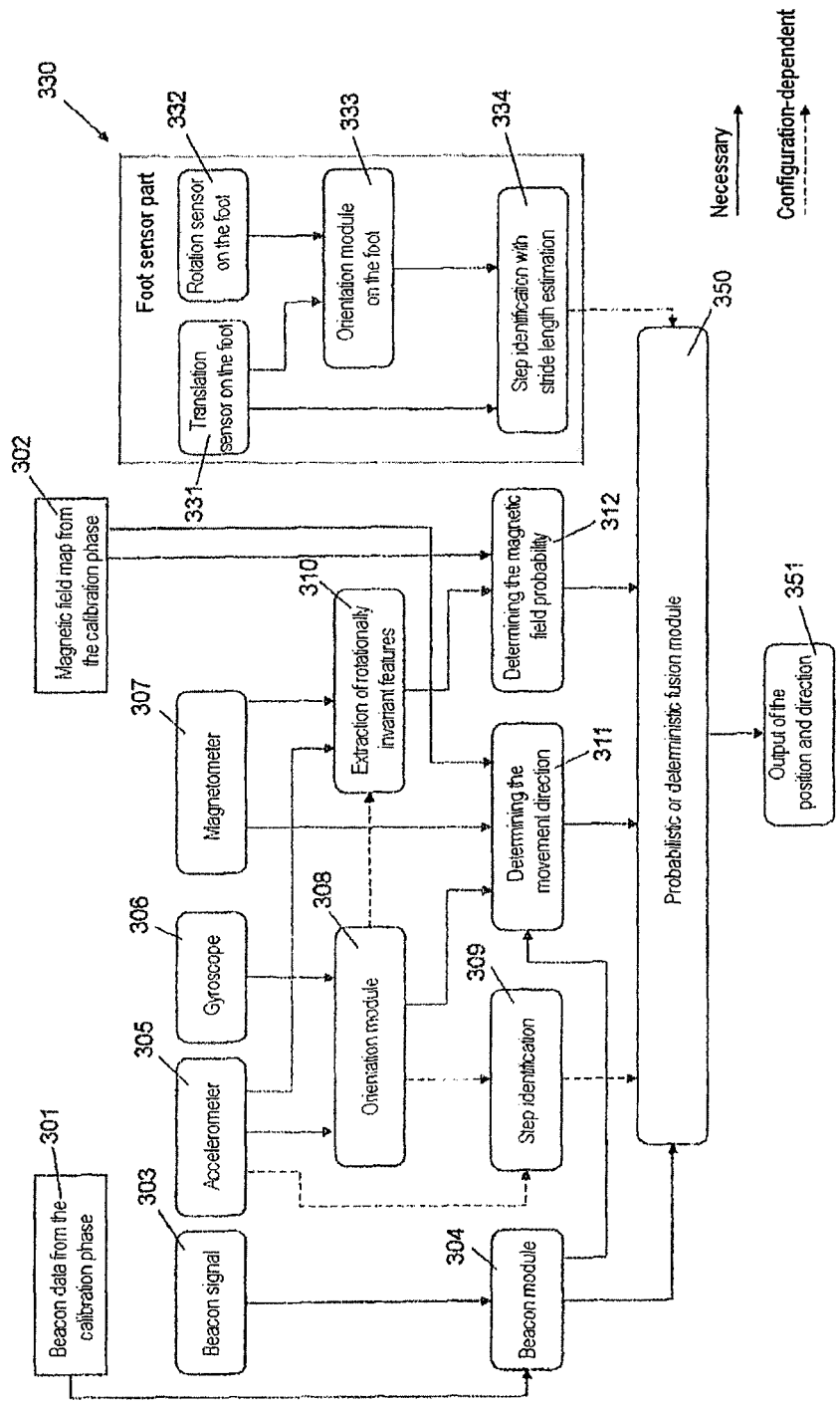

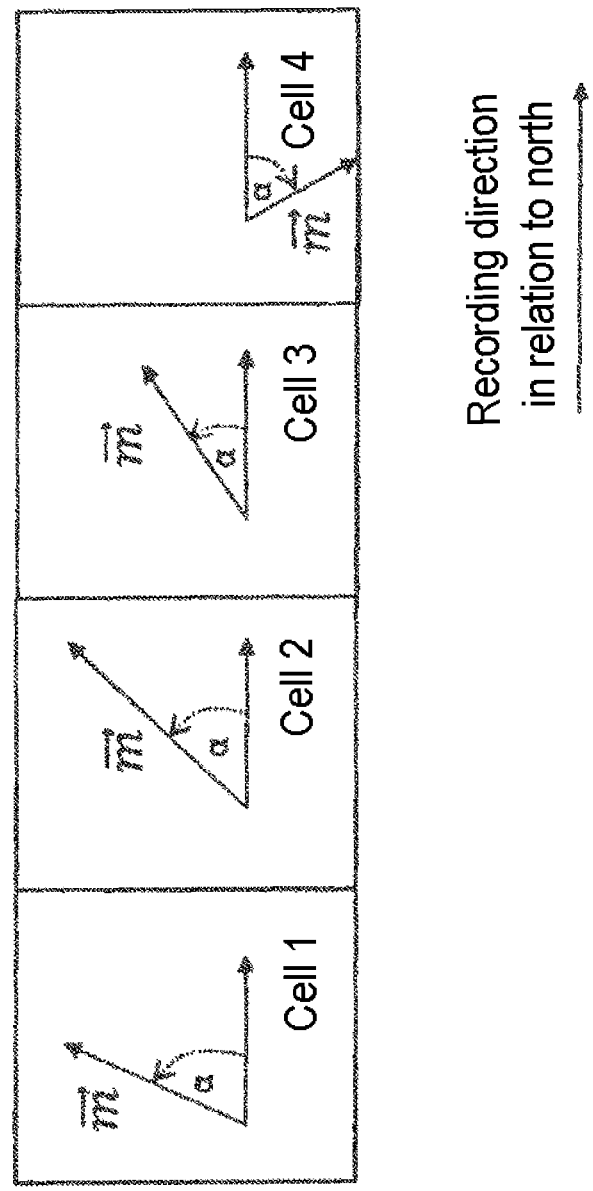

LOCALIZATION APPARATUS AND LOCALIZATION METHOD

CROSS-REFERENCE TO RELATED APPLICATIONS

This application is the United States national phase of International Application No. PCT/EP2016/050817 filed Jan. 15, 2016, and claims priority to German Patent Application Nos. 10 2015 100 591.3 and 10 2015 205 097.1, filed Jan. 15, 2015 and Mar. 20, 2015, respectively, the disclosures of which are hereby incorporated in their entirety by reference.

BACKGROUND OF THE INVENTION

Field of the Invention

The invention relates to a localization apparatus and a localization method.

Description of Related Art

The importance of the localization of persons and/or appliances has become more important in recent years as a result of using navigation appliances, e.g. in automobiles, on a large scale.

However, no solution which meets the requirements of an in-building localization has become generally accepted within buildings (e.g. shops, airports, factories, office buildings, stations). An in-building positioning system suitable for daily use should:
- make do with as little additional infrastructure as possible,
- have a localization accuracy of approximately two meters,
- be able to supply localizations, i.e. positions, in real time, and
- be relatively cheap to install and service.

Many existing solutions do not simultaneously meet all of the aforementioned points. Many solutions are based on comparing received signal strengths from routers with a "signal strength fingerprint" map that was measured in advance. A problem of these solutions is, inter alia, that the signal strength at a location varies over time, for example as a result of interferences. Hence, it is not possible to obtain a satisfactory accuracy, which has a reasonable cost ratio, using this solution on its own.

Other solutions use acceleration and rotation sensors in order e.g. to determine the steps of a user and the direction and stride length thereof. Use is made of pedometers, but also foot sensors. However, this assumes a known start position or said start position is determined during a calibration phase using map information, e.g. by way of a particle filter. However, this calibration phase only leads to success in appropriate building structures and after a certain amount of time.

A further widespread problem in this case lies in determining the direction that should be assigned to a step. As a rule, the movement direction is determined using a compass, leading to a poor result in most buildings on account of strong deflections of the Earth's magnetic field by way of metallic structures. Other solutions use rotation sensors in order to determine the direction in relation to an initial alignment. However, the accuracy of this way of determining the direction reduces over time on account of non-negligible measurement errors.

Moreover, there are approaches which use measured static magnetic fields by way of the comparison with a magnetic field map for determining the location in accordance with a fingerprint method. However, known solutions are disadvantageous here in that the employed features are dependent on rotation. Thus, the alignment of the appliance in the Earth's coordinate system must be known very accurately, and this is usually not possible with the required accuracy in practice.

SUMMARY OF THE INVENTION

Therefore, an existing object is that of providing apparatuses, systems and methods which operate more exactly.

The object is achieved by a localization apparatus having features as described herein.

Here, use is made of three systems which record data independently of one another.

A movement sensor system comprising at least one translation sensor (e.g. a sensor for linear movements, an accelerometer, an inertial measuring appliance for linear movements) and at least one rotation sensor (e.g. a gyroscope) serves to capture linear movement variables or rotational movement variables that act on the localization apparatus. In particular, these may be linear accelerations and/or rotational accelerations, but also position measurements or speed measurements.

At least one magnetometer apparatus serves to capture magnetic field data in the localization space, wherein rotationally invariant magnetic features are determinable from measured magnetic raw data that are rotationally dependent by means of an internal or external data processing apparatus. As a result of using rotationally invariant magnetic features, there is no need to correct measured magnetic field data that are rotationally dependent. Hence, the localization apparatus may e.g. be held with arbitrary spatial orientation in the localization space since the captured magnetic field data are reduced to rotationally invariant data.

A means serves to determine an absolute position of the localization apparatus in the localization space.

By way of an integrated data processing apparatus or a coupling to an external data processing apparatus, the measurement data of the movement sensor system are available using a magnetic field map that was stored in advance, having magnetic parameters, in particular using the rotationally invariant features, of at least parts of the localization space and for processing the determined absolute position.

By evaluating three types of physical data that are obtained independently of one another (e.g. the movement data, the rotationally invariant magnetic field data and e.g. the wireless signals of a radio beacon), it is possible to efficiently achieve an increased locating accuracy of the localization apparatus in the localization space.

In an advantageous embodiment, the at least one translation sensor, the at least one rotation sensor and/or the at least one magnetometer apparatus are embodied as a one-axis, two-axis and/or three-axis measuring means. Using this, it is possible to determine the position and orientation along a one-dimensional environment, such as e.g. a corridor, in a plane or in a space.

It is also advantageous if an embodiment of the localization apparatus is embodied as a mobile hand-held appliance and/or as a portable system for a user.

For the purposes of calculating the rotationally invariant magnetic field data, the movement sensor system is used in one embodiment to measure the local direction of the Earth's gravity field.

Also, a measured magnetic field vector can be projected onto the direction of the local Earth's gravity vector for obtaining a rotationally invariant feature in one embodiment.

In a further advantageous configuration, the means for determining an absolute position of the localization apparatus comprises a radio module for receiving wireless signals, in particular radio data from a radio beacon in the localization space.

Alternatively, or additionally, it is possible for the means for determining the absolute position of the localization apparatus to comprise an evaluation means for an optical marker, in particular a QR code. By way of example, an absolute position in the space may be effectuated by recording a QR code by means of a camera apparatus in order to determine the absolute position.

The accuracy can be improved if, in one embodiment, at least one sensor part at an extremity of the user captures data about movement variables at the extremity and transfers these to the data processing apparatus. Thus, the step movements can be captured more accurately by means of a foot sensor such that the position data on account of the movement are more precise and therefore able to supply an improved result when fusing the data. By way of example the data fusion can be carried out in the data processing apparatus.

Here, in one embodiment, a filter, in particular a probabilistic filter, very particularly a probabilistic grid-based Bayesian filter, is usable, in particular, for processing the rotationally invariant features. In this context, a filter can also be embodied as an estimator.

The problem is also solved by a method having features as described herein.

Here, the method for localizing a localization apparatus comprises the following steps a) to c), which can be carried out at least once in any sequence:
 a) calculating the direction and length of a movement of the at least one localization apparatus, proceeding from the initial position, by way of a translation sensor and a rotation sensor for determining a first position data record,
 b) calculating a second position data record by evaluating a magnetic field map that was stored in advance and measurement results from a magnetometer apparatus, wherein, for the purpose of improving the accuracy, rotationally invariant magnetic features are determinable by means of the data processing apparatus,
 c) determining a third position data record of the at least one localization apparatus depending on an absolute position in the localization space.

Subsequently, there is fusing of the first position data record, second position data record and third position data record, in particular using a statistical method in relation to a calculated position of the at least one localization apparatus. The fusing is undertaken in a data processing apparatus.

The accuracy of the method can be improved if the current position is determined depending on a wireless signal, in particular on radio waves of a radio beacon, and/or depending on a position marker, in particular an optical marker.

In a further embodiment of the method, the current position of the at least one localization apparatus is equated with the absolute position, in particular the one position of a radio beacon and/or one position of the position marker, if the at least one localization apparatus is situated within a predetermined distance from the absolute position.

In a further embodiment, at least one sensor part at an extremity of the user, in particular as a foot sensor, captures data about movement variables at the extremity and transfers these to the data processing apparatus.

Also, in one embodiment, a filter, in particular a probabilistic filter, very particularly a probabilistic grid-based Bayesian filter, can be used for processing the rotationally invariant magnetic features.

The movement sensor system can also capture the local direction of the Earth's gravity field.

BRIEF DESCRIPTION OF THE DRAWINGS

Exemplary embodiments of the localization apparatus and of the method for localizing are described on the basis of figures. In the figures:
FIG. 2A shows a flowchart for the calibration phase;
FIG. 2B shows a flowchart for recording a magnetic field map;
FIG. 3 shows a flowchart for a localization phase of a localization apparatus;
and
 FIG. 4 shows a schematic illustration of four cells with magnetic field deviations.

DETAILED DESCRIPTION OF THE INVENTION

Figure 1:
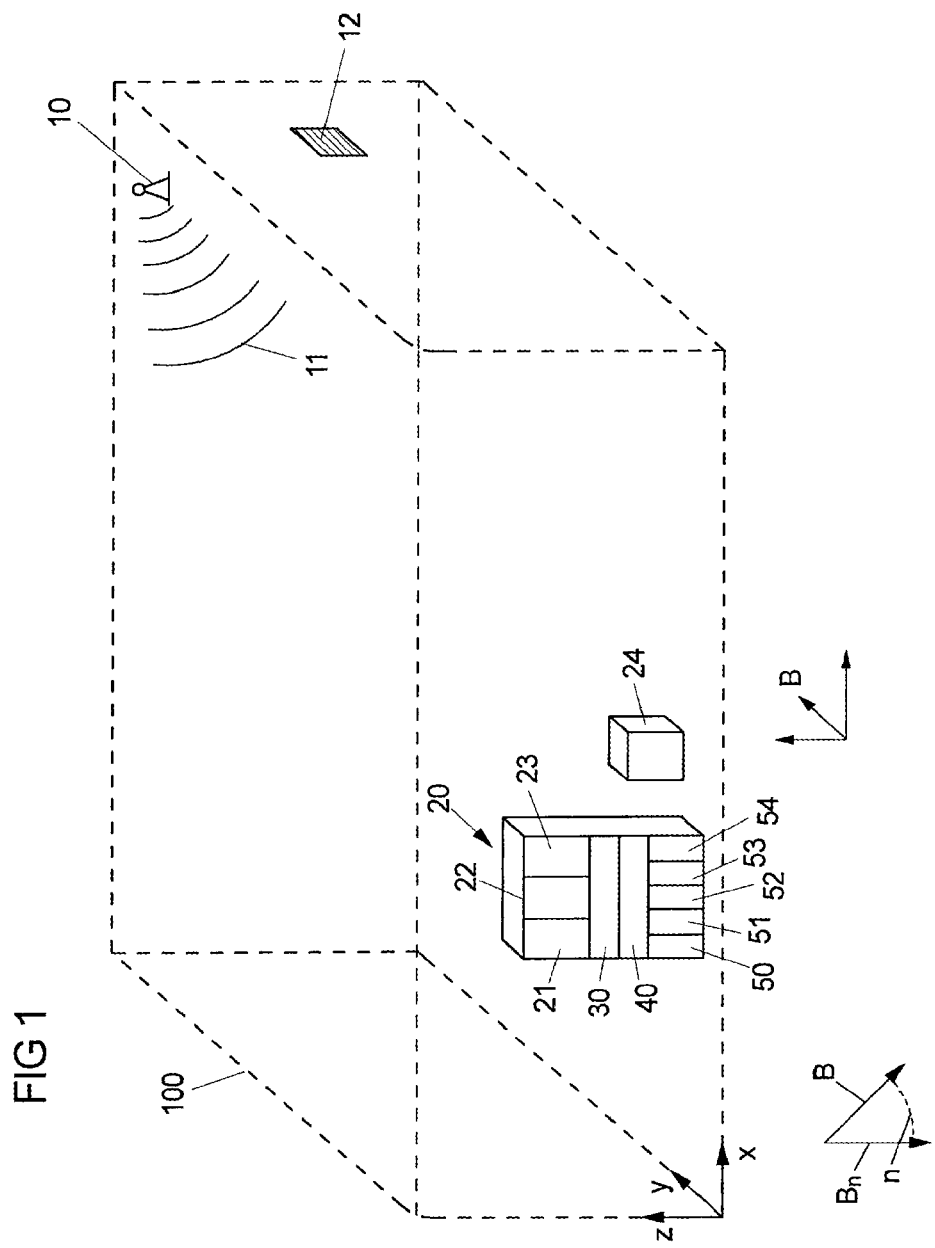
FIG. 1 shows a localization apparatus in a building as a localization space.

The embodiments presented in an exemplary manner below facilitate the calculation of the position of an apparatus (referred to as a localization apparatus 1 below) within a building, even without e.g. a GPS signal being present. In FIG. 1, the localization apparatus 1 is arranged in a localization space 100 wherein, for reasons of simplification, the localization space 100 is presented here as a cuboid.

In general, the localization space 100 will have a much more complex embodiment, as is the case in buildings such as train stations, factories or airports. In particular, the localization space 100 may also extend over more than one level and have a geometrically complex structure. It is not mandatory for the localization space 100 to be situated wholly or partially within a building. The localization space 100 may be arranged wholly or partially in open space. As a result of this, it is possible, for example, to ensure a transition from a different localization method to the one described here.

First of all, the initial position of the localization apparatus 1 is calculated by measuring the field strength of a specific radio signal 11 that is emitted by a wireless transmitter 10, in this case a radio beacon 10. If the user of the localization apparatus 1 moves away from the radio beacon 10, the traversed path is calculated by at least one translation sensor 21 and at least one rotation sensor 22 such that the position and the alignment of the localization apparatus 1 are known. Here, the rotation sensor 22 can capture the rotational angle, the rotational speed and/or the rotational acceleration.

Here, the radio beacon 10 serves to determine an absolute position in the localization space 100.

Additionally, or alternatively, a position marker 12, such as e.g. a QR code, may also serve to this end for determining the absolute position.

If the localization apparatus 1 or the user is once again situated in the vicinity of such a radio signal 11, the position and alignment of the localization apparatus 1 are corrected. Additionally, it is possible to determine the position of a localization apparatus 1 which is equipped with a magnetometer apparatus on account of the comparison of currently ascertained or calculated rotationally invariant magnetic field features and a map of same magnetic field features and the positions thereof with the aid of a probabilistic filter (also referred to as estimator in this case). This will still be described below.

The embodiments of localization apparatuses 1, of systems for localizing localization apparatuses 1 and of localization methods described herein may, in particular, be used as a localization component in an indoor positioning or navigation system for pedestrians; however,—as already mentioned above—the embodiments are not restricted to the indoor region.

Until now, there has been no widely available navigation for closed buildings. A navigation usually ends in front of the building which was the intended target of the guidance. Using the embodiments proposed herein, it is now possible to facilitate navigation and orientation even within buildings.

This is particularly helpful in large and/or complexly formed localization spaces 100 such as airports, factories, office buildings, shopping malls or train stations, in which users can be located or navigated with the aid of the localization apparatuses 1. In particular, the locating can be used for visually impaired or blind persons, or else for autonomous machines.

In the process, solutions that are already known per se are used and extended in order to obtain a significantly higher positioning accuracy. Thus, radio beacons 10 are only used in the more reliable vicinity. The data records are fused with step algorithms to form a significantly improved directional accuracy. Moreover, rotationally invariant magnetic field features and map information may be included in the fusing by way of a probabilistic filter. The determination of the movement direction on the basis of inertial sensor systems in conjunction with a magnetic field map and measured magnetic fields is also innovative.

The localization apparatus 1 which, in particular, is used for indoor localization comprises at least one movement sensor system 20 with a three-axis translation sensor 21, a three-axis rotation sensor 22 (e.g. gyroscope) and a three-axis magnetometer apparatus 23. In particular linear accelerations or linear speeds can be captured by the translation sensor 21; in particular rotational accelerations or rotational speeds can be captured by the rotation sensor 23.

The magnetometer apparatus 23 can determine the magnetic field strength and/or flux density of the Earth's magnetic field and the changes therein.

All three sensors 21, 23, 23 have a three-axis embodiment in this case, and so they can capture the values in space, i.e. in three dimensions. However, it is also possible in alternative embodiments to use one-axis, two-axis translation sensors 21 and rotation sensors 22 if the localization appliance 1 should only be localized along a curve (or straight line) or in a plane. It is not mandatory for the translation sensor 21 and the rotation sensor 22 to be embodied as separate components; the sensors 21, 22 may also be integrated into a component which captures translational and rotational movements.

Ultimately, three linear acceleration components are captured by the translation sensors 21 and three rotational acceleration components are captured by the rotation sensors 22 in the depicted embodiment such that a complete determination of the location of the localization appliance 1 in the localization space 100 is possible.

It likewise comprises a data processing apparatus 30 (computational and memory unit) and a radio module 41 for receiving the radio signals from the radio beacons 10. By way of example, these hardware components can be installed in a smartphone. The smartphone is worn securely on the body, level with the hip or chest, or held in the hand in the movement direction. Hence, the smartphone has a localization apparatus 1 or it may even be considered entirely as such.

In alternative embodiments, the movement sensor system 20, the data processing apparatus 30 and the radio module 41 are integrated into a dedicated casing or coupled together with another device, such as e.g. a radio appliance, or integrated therein. The data processing apparatus 30 may also be arranged wholly or partly outside of the localization apparatus 1.

The localization apparatus 1 further comprises an orientation module 50 for determining a directional vector localization apparatus 1, a step identification module 51 and a module for determining the movement direction 52.

For the sensor systems of a localization apparatus (e.g. cell phone and foot sensor), the orientation module 50 calculates the rotation of the sensors in space. The result is, for example, a quaternion. As a rule, this is the alignment in relation to the floor and the relative yaw movement). This is necessary, inter alia, in order e.g. to interpret sensor values and subtract the gravitational acceleration from the correct components.

The movement direction module 52 relates to the sensor data of the movement sensor system which is held in the movement direction (e.g. as a cell phone). It specifies the absolute movement direction of the user in relation to north. To this end, it uses the relative yaw angle of the orientation module, the magnetic field map 31, the magnetometer apparatus and the current position estimates.

The step identification module 51 operates, for example, like a known pedometer in a smartphone, with which the step frequency is ascertained on the basis of acceleration measurements. The distance between acceleration peaks that, for example, is established by means of software may be interpreted as a step. If a mean stride length is assumed (or measured), this allows the traversed distance to be determined.

These modules 50, 51, 52 receive the measurement results of the movement sensor system 20, of the magnetometer apparatus 23 and/or of the radio module 41 and may be implemented as software or hardware.

Moreover, a magnetic field map 31 of the localization space 100 (i.e. the spatial region in which the localization apparatus 1 can be located) or of the portions thereof needs to be recorded in advance. In the embodiments depicted here, the magnetic field map 31 is stored in the data processing apparatus 30.

In alternative embodiments, the magnetic field map 31 can be stored in a central data processing apparatus 30, with necessary data being transferred to the localization apparatus 1.

At least the directional deviations of the magnetic field B at various positions of the localization space 100 may be registered in the magnetic field map 31. The radio module 41 of the localization apparatus 1 recognizes radio beacons 10 in the vicinity and assigns these to a position in the localization space 100.

The orientation module 50 captures data from the translation sensor 21 and from the rotation sensor 22 and fuses these in order therewith to determine the orientation of the localization apparatus 1 in respect of its absolute alignment in relation to the floor of the localization space 100 and in order to capture a relative yaw movement of the sensors 21, 22.

Here, fusing is understood to mean that data from different sources, e.g. the movement sensor system 20 and the magnetometer apparatus 22, are combined by calculation in such a way that a consolidated, i.e. more accurate, localization information item is obtained.

The step identification module 51 detects typical step movements of a user by way of an acceleration sensor as a translation sensor 21.

The module for determining the movement direction 53 ascertains the absolute alignment of the localization apparatus 1 in respect of the direction toward north by way of the measured magnetic field direction using the magnetic field map 31, preferably at positions of the radio beacon 10. Between the positions at which the magnetic field map 31 is used, the module for determining the movement direction 53 must determine the direction by way of an inertial sensor system (movement sensor system) relative to the last known direction.

If these modules with the aforementioned properties are fused, an accurate position determination is possible.

In an alternative embodiment, the step identification module 51 may also use a second movement sensor system which is fastened to a body part of the user which, in the case of a running motion, experiences a movement phase and a stationary phase. By way of example, this is the case on the foot. After each step, the foot sensor can transmit a step length by way of a wireless connection. The smartphone as the data processing apparatus 30 then fuses the results of the modules 50, 51, 52, as a result of which a very high accuracy is possible.

Fusion with rotationally invariant magnetic field features by way of a module for using rotationally invariant magnetic features 54 is likewise expedient.

To this end, these features need to be calculated from previously measured raw data and registered in the magnetic field map 31. A probabilistic grid-based Bayesian filter fuses these features with the step identification module 51, the beacon module and the movement direction module 52 during the localization. It is likewise expedient to incorporate the information about adjacent cells or about the positions of obstacles, such as walls, into the probabilistic filter as well.

In principle, it is also possible to use a different design of a filter or an estimator for fusing purposes.

Depending on the configuration, different features (e.g. direction information, rotationally invariant magnetic features) need to be stored in the magnetic field map 31. The region to be covered, i.e. the localization space 100, is subdivided into cells. By way of example, these may have a size of approximately one square meter.

The features are recorded and stored for each cell; this is described in more detail in conjunction with FIG. 4. In order to obtain a correction of the movement direction, as is described further below, the deviations of the measured magnetic field vector in relation to the unperturbed Earth's magnetic field must be registered. FIG. 4 presents four cells, wherein the magnetic field vector $\vec{m}$ in each cell has an angle deviation $\alpha$ in relation to the direction of true north. The angle deviation $\alpha$ is stored in advance.

Here, the difference between the angle $\alpha$ in which the recording machine was held in relation to north and the angle of the magnetic field measured during the recording in the xy-plane lying parallel to the floor is calculated. The mean value and the variance of all differences occurring in a cell are calculated and stored. The number of cells stored is variable.

However, cells which have a small standard deviation of the angle and lie in the vicinity of a radio beacon 10 should have particular preference.

If use is made of an embodiment with the "use of rotationally invariant magnetic features" module 54, these features need to be registered in the magnetic field map 31.

The magnetometer apparatus 23 must be calibrated before the map is recorded. The mean value and the standard deviation of all values occurring in a cell are determined and stored for each feature. The connections of the cells are likewise stored, as a result of which the path network is stored.

Moreover, it is possible to set up cells in the external region at the entrances and exits of the building, i.e. of the localization space 100, and to characterize these as such. As a result, it is easily possible to recognize later when the user has left the building by examining whether the closest cell to the calculated position is characterized as an external cell or internal cell. Alternatively, it is also possible to store the building boundaries.

The embodiments are based on a targeted combination of the individual modules, which are described below.

By way of example, the modules can be implemented in a smartphone, which comprises the required components, or on an external movement sensor system (e.g. integrated with a radio appliance or any other mobile handheld appliance) with the data processing apparatus 30. However, it is also possible for the data processing apparatus 30 to be wholly or partially integrated into the smartphone.

Here, importance is placed on the orientation module 50 which calculates the orientation of the movement sensor system 20 in the localization apparatus 1, at least in respect of the alignment in relation to the floor of the localization space 100.

However, it is also possible to determine the full alignment in the Earth's coordinate system. This calculation is carried out for every employed movement sensor system 20.

The at least one step identification module 51 is likewise required. A sensor that is fastened to the body or held in the hand, or a smartphone, can identify step events. This information can be incorporated, for example, by way of a stride length that is assumed to be constant.

Here,—as described above—it is expedient to fuse this with magnetic field features in a Bayesian filter.

The other, significantly more accurate variant lies in the use of a foot sensor. It is able to transmit the traversed path in the three spatial coordinates to the fusing module.

Many of the individual modules specify a probability distribution in addition to the estimated value. Said probability distribution can later be used for fusing purposes in the probabilistic filter.

The object of the orientation module 50 is to determine the alignment of the localization apparatus 1 in the Earth's coordinate system or in an independently set coordinate system, i.e. in the localization space 100.

One orientation module 50 must be implemented in each case for each employed movement sensor system 20, such as e.g. the smartphone or a foot sensor. The orientation may be represented in the form of Euler angles or a quaternion.

To this end, the inertial sensor system consisting of at least one multi-axis translation sensor 21 and at least one multi-axis rotation sensor 22 and at least one magnetometer apparatus 23 is determined.

By way of targeted fusing of translational and rotational data, it is possible to compensate drift errors of the rotation sensor 22. By way of example, it is possible, to this end, to use the fusing algorithm by Sebastian Madgwick (UK Sebastian O. H. Madgwick. Harrison; Vaidyanathan Dept. of Mech. Eng.; Univ. of Bristol, Bristol. Estimation of imu and marg orientation using a gradient descent algorithm. 2011.)

This fusion is also referred to as 6D sensor fusion. The rotation sensor 22 merely supplies information about the rotation of the localization appliance 1 that is relative to an initial alignment.

By contrast, on account of the gravitational acceleration, the translation sensor provides absolute information about the roll and pitch angle.

The 6D sensor fusion offers no option for determining the yaw angle in respect of the Earth's coordinate system if no initial alignment is known.

Alternatively, it is possible to use a 9D fusion algorithm which also integrates magnetic field data and therefore is also able to determine the yaw angle absolutely.

However, this variant, as a rule, has disadvantages on account of poor compass results within buildings. It is for this reason that use is predominantly made of 6D fusion, as a result of which the z-component of the localization appliance 1 can be reliably determined and extracted. However, the yaw angle has a drift and is relative to an initial alignment. The yaw angle has to be corrected by compass measurements. However, this is not carried out in the orientation module 50 but when determining the movement direction.

On account of poor compass results in buildings, this embodiment may be disadvantageous in that the magnetic field vector does not reliably point north, for example as a result of metallic structures in the building material and in the interior furnishing.

It is for this reason that use can predominantly be made of 6D fusion in the orientation module 50 without the magnetometer apparatus 23, as a result of which the z-component of the localization appliance 1 can, as described above, be reliably determined and extracted. However, as a result thereof, the yaw angle of the 6D fusion is only relative to an initial alignment and has a drift which, inter alia, depends on the quality of the employed rotation sensor but which, in practical terms, cannot be prevented. Thus, the error of the calculated yaw movement in relation to the initial position increases over time.

In order to convert the relative yaw angles into absolute angles, for example in relation to north, a reliable compass measurement or a different absolute determination of direction, such as e.g. by way of optical markers, is necessary. This absolute alignment is not mandatory for every movement sensor system 20, and this is why it is not calculated in the orientation module 50. The module for determining the movement direction 52 uses the calculated relative yaw angle of an orientation module 51 and fuses it with corrected magnetic field measurements at specific positions. As a result, absolute directional specifications are made possible and the drift errors are corrected. The module for determining the movement direction 52 is explained in more detail below.

Below, the function of the step identification module 51 is described in more detail. For the purposes of purely identifying a step, it is possible to evaluate the upward and downward movement of the translation sensor 21 which, for example, is level with the hip. To this end, use is made of the z-component of the acceleration vector in Earth coordinates. Hence, before this, the acceleration data must be converted with the aid of the sensor alignment calculated by the orientation module 50. The signal is then subjected to low-pass filtering. Subsequently, a decision is made by way of a threshold as to whether a step has taken place. If, as presented here, use is only made of one pedometer, the assumption can be made that each step has a predefined fixed mean stride length $\bar{d}_s$ with a standard deviation $\sigma_S$. After an identified step, the probability of a position $r=(r_x, r_y, r_z)$ is updated by way of the Gaussian function $P_d$ with given measurement values m and the last position r'.

The term measurement values or measurement data relates here to the input values of the filter and, for example, also contains the previously calculated rotationally invariant magnetic data.

Here, d(r, r') describes the Euclidean distance between the position r and the given previous position r'. The function $d_S(m)$ characterizes the output value of the step identification module 51, which depends on the measured acceleration data.

The output value can either have the value $\bar{d}_s$ if a step event was identified or the value is 0 if no such event is present.

$$P_d(r \mid m, r') = \frac{1}{\sqrt{2\pi}\,\sigma_s} e^{-\frac{1}{2\sigma_s^2}(d(r,r')-d_S(m))^2}.$$

On its own, this information is only evaluable in conjunction with a directional information item. Therefore, this probability is fused with the probability from the module of the movement direction. What emerges is the probability $P_{step}$ of a position r in the case of given three-axis rotation sensor 22 measurement data, three-axis translation sensor 21 measurement data and the last position r'.

$$P_{step}(r \mid m, r') = \frac{P_d(r \mid m, r')P_\Psi(r \mid m, r')}{p(m, r')},$$

$$p(m, r') = \sum_r P_d(r \mid m, r')P_\Psi(r \mid m, r').$$

The variable $P_\Psi$ will still be described further below.

The step identification module 51 with the stride length estimation is described below. It is disadvantageous to use a fixed stride length since the stride length both differs from user to user and depends on the situation in which a user is. By way of example, stride lengths differ if one walks quickly or rotates on the spot.

In order to obtain a usable estimate of the stride length, the user must fasten the movement sensor system 20 with a three-axis translation sensor 21 and three-axis rotation sensor 22 to e.g. their body. The location of affixment should be selected in such a way that the system experiences a stationary phase and a movement phase during a step. Two possible positions are at the foot of the user and at their ankle. The acceleration values $a_x$, $a_y$ and $a_z$ measured with this configuration contain information about the movement of the step of the user in the x-, y- and z-direction. If the acceleration in each direction is integrated once over time t, the corresponding speeds $v_x$, $v_y$ and $v_z$ are obtained and the traversed distances $d_x$, $d_y$ and $d_z$ are obtained by a second integration:

$$v_i = \int a_i(t)dt,$$

$$d_i = \int v_i(t)dt.$$

In practice, in particular cost-effective MEMS acceleration sensors have an unknown error, which is not constant over time and temperature. This error produces a position error which has a $t^2$-dependence, caused by the two-fold integration. Previous scientific examinations (Jaime Gomez Raul Feliz, Eduardo Zalama, Pedestrian tracking using inertial sensors, JOURNAL OF PHYSICAL AGENTS, VOL 3, NO 1, 2009) have shown that this error can be corrected if the translation sensor 21 has a known speed at a given time.

Since each step of a user has both an acceleration phase (foot in the air) and a stationary phase (foot on the floor), a speed of zero can be assumed for the stationary phase. Hence, the error is obtained by virtue of measuring the acceleration during the stationary phase.

There are various options for deciding which phase of a step is present at a given time t.

One option consists of using the measurement values $g_x$, $g_y$, $g_z$ of the rotation sensor 22 because the foot does not rotate during the stationary phase, and hence the measurement values in this phase are usually close to zero. This applies for all three axes, which is why it is possible to use the magnitude of the measured values.

In order to avoid an incorrect identification of a stationary phase, it is possible, for example, to filter the measured magnitudes using a low-pass filter so as to obtain the signal $g_{tp}$. The phase information S can be extracted using a thresholding technique:

$$S(t) = \begin{cases} 1: & g_{tp}(t) \geq \text{threshold} \Rightarrow \text{swing phase} \\ 0: & \text{otherwise} \Rightarrow \text{stationary phase} \end{cases}.$$

In the discrete case, the speed can be calculated by virtue of adding the acceleration measurement values with the index t and the time step $\Delta t$. Since $a_z$ also includes gravity, it is necessary to subtract the Earth's gravitational component therefrom before the acceleration is integrated in the z-direction (here in a discrete approximation):

$$v_i(t) = \sum_{k=0}^{t} a_i(k)\Delta t.$$

Here, use is made of the approach by Gomez et al. for correcting the speed with knowledge from the stationary phase. The current error of the speed can be calculated as mean value $\overline{V}_i$ of the speeds along each axis i. After the first integration, the measurement error of the translation sensor 21 increases proportionally with t. Thus, the error from the swing phase can be corrected using the error value known from the stationary phase and the information about the start of the swing phase $t_{start}$ and the end $t_{end}$ thereof.

$$\tilde{v}_i(t) = \begin{cases} v_i(t) - \dfrac{t - t_{start}}{t_{end} - t_{start}} \overline{V}_i: & \text{if } S(t) = 1 \\ 0: & \text{otherwise} \end{cases}.$$

Now, it is possible to calculate the distance $d=(d_x, d_y, d_z)$ from the start position with the corrected speeds for respectively one axis:

$$d_i(t) = \sum_{k=0}^{t} \tilde{v}_i(k)\Delta t.$$

The stride length should be updated after each step, i.e. always at the time index $t_{end}$. Consequently, $d(t_{end})$ is the distance vector of a step. After the distance vector was introduced into the probability function, the step module must be restarted for the next measurement values such that a forwarded distance vector relates to the preceding step in each case:

$$P_{step}(r|m, r') = \frac{1}{\sqrt{2\pi}\,\sigma_S} e^{-\frac{1}{2\sigma_S^2}(r,r')+d(t_{end})^2}$$

A calculation of the probability like in the individual module with a fixed stride length over the fusion with the movement direction is likewise expedient. However, a fixed stride length is then replaced by the magnitude of the estimated stride length in the xy-plane. This is particularly expedient in the case of a foot sensor since the yaw angle on the foot often only emerges reliably from the 6D fusion. The absolute yaw angle in relation to the Earth's coordinate system can be gathered with this fusion of the movement direction.

$$\overline{d}_S = \sqrt{d_x^2 + d_y^2}$$

$$P_d(r|m, r') = \frac{1}{\sqrt{2\pi}\,\sigma_S} e^{-\frac{1}{2\sigma_S^2}(d(r,r')-d_S(m))^2}$$

$$P_{step}(r|m, r') = \frac{P_d(r|m,r')P_\Psi(r|m,r')}{P(m,r')}.$$

The direction of the step is then assumed to be the movement direction. The module for determining the movement direction operates with magnetic field data that are level with the hip. Since these are more constant, there can be better corrections with the magnetic field map in this case.

Thus, the stride length is determined at the foot and the direction is determined level with the hip.

Often, the magnetic field level with the foot is disturbed more strongly and, especially, is significantly less constant in space than e.g. level with the hip. This is due to metallic structures in the floor, the influence of which reduces with the square of the distance. Therefore, the orientation module 51 uses a 6D fusion (i.e. without a magnetometer) for the foot sensor system. As described, the xy-angle at the foot thus drifts over time and dx and dy relate to an initial alignment, which cannot be determined in absolute terms without a magnetometer apparatus 23. Therefore, only the magnitude, i.e. the absolute stride length, is communicated in this implementation and the direction of the foot is initially discarded.

The use of rotational invariants of the magnetic features is described below.

In the module 54 for using rotationally invariant magnetic features, the measured magnetic field values should be compared to the values that are stored in the magnetic field map 31. If the features correspond to specific positions, the occupancy probability should be high there. Other magnetic features are also used in the US patent application 2013/0179074.

The measurement values of magnetic field data depend on the orientation of the magnetometer apparatus 23. While the alignment of the magnetometer apparatus 23 in relation to the floor can be determined relatively reliably by the orientation module, the yaw angle is a problematic variable. If the magnetometer apparatus 23 thus has a different rotation when recording the data than during the localization, then hardly any correspondences arise, leading to poor localization results. This can be prevented by pre-processing the magnetic field raw data in order to obtain rotationally invariant features.

The magnetic field B(x) at the location x is a three-dimensional vector $B=(B_x, B_y, B_z) \in \mathbb{R}^3$. The group of the three-dimensional rotations O(3) is defined by the set of all transformations which leave the scalar product of $\mathbb{R}^3$ invariant. Hence, the first O(3) rotationally invariant feature of the magnetic field is the norm of its flux density $$|B|=\sqrt{\Sigma B_i^2}.$$

The subgroup O(2) of the two-dimensional rotations about the z-axis leaves the z-component $B_z$ of the flux density invariant. The z-axis of the world coordinate system is parallel to the unit vector n of the direction of the Earth's gravitational field and can be determined by the translation sensor 21 or by the 6D orientation module 50. The projection $B_n = B_n = \Sigma B_i n_i$ of the magnetic field components in the reference system of the appliance relative to the z-axis of the world coordinate system is the second O(3) rotationally invariant feature.

One embodiment includes pre-processing of the measured three-dimensional magnetic field vector $B=(B_x, B_y, B_z) \in \mathbb{R}^3$ into the rotationally invariant features:
1) The norm $|B|=\sqrt{\Sigma B_i^2}$
2) The projection $B_n = B_n = \Sigma B_i n_i$ This projection of the magnetic field vector B onto the normalized Earth's gravity vector n is depicted in FIG. 1.

By processing the three components of the magnetic flux density $B_x$, $B_y$, $B_z$ into the rotationally invariant features $|B|$ and $B_n$, the rotational invariance is obtained in exchange for one degree of freedom.

However, this loss of information is a good compromise which protects against the aforementioned orientation problem and thus provides a significant advantage of the claimed system over previous solutions.

As described above, the features are stored for each cell $b_i$ in the magnetic field map 31 $M_i=(|B|, B_n)_i$. To the extent that the deviation $d_i=m-M_i$ between measured magnetic features $m=(|B|, B_n)$ and the map data $M_i$ is small, the probability is high that m is the correct value for the cell $b_i$. In principle, use can be made of any probability distribution which satisfies this condition.

Below, a Gaussian distribution $N(d_{ik}, \sigma_x)$ with a suitable variance $\sigma_k$ for each feature $d_{i1}=|B|-(|B|)_i$, $d_{i2}=B_n-(B_n)_i$ is assumed. The overall probability for a position r within a cell $b_i$ can be measured for the measurement values m at each time or iteration step t.

$$P(m_t \mid r \in b_i) = \prod_k N(d_{ik}, \sigma_k)$$

A beacon module 55 (e.g. using a Bluetooth module in the localization apparatus 1) of the radio beacon 10 is described below, by means of which the absolute position in the localization space 100 is determinable. By way of the beacon module 55, it is possible to determine the pinpoint geo-position and orientation of the localization appliance 1 (and hence optionally the position of the user). To this end, the beacon module 55 transmits a plurality of radio pulses per second. The radio pulses contain, inter alia, the unique identification number or the position of the beacon module 55 and may also contain further values. The localization apparatus 1 of the user receives these pulses and queries either a local database or a remote database for the position of the radio beacon 10 or receives the position of said radio beacon directly with the pulses. Since the radio signal 11 has a low transmission strength, the localization apparatus 1 of the user must be situated within a small radius (approximately <15 meters) around the radio beacon 10.

In order to further restrict this radius, it is possible to e.g. only switch the radio beacon 10 on if the user is situated therebelow (e.g. using a photoelectric sensor or an infrared sensor). Moreover, it is possible to additionally analyze the signal strength of the received radio pulses 11. During the analysis, the localization appliance 1 of the user ascertains the signal strength of one radio signal 11 of the radio beacon 10 or ascertains the signal strengths of a plurality of radio signals 11 of the radio beacon 10. If this value exceeds a threshold, the position of the user is set equal to the position of the radio beacon 10. The threshold is either set for all radio beacons 10 or it is set to a specific value for a radio beacon 10, the localization appliance 1 either receiving said value directly with the radio signal 11 of the radio beacon 10 or ascertaining this by way of the database.

In order to determine the orientation of the localization apparatus 1 at a radio beacon 10, the magnetic correction angle is either ascertained directly by way of the radio signals 11 of the radio beacon 10 or ascertained by way of a query of the database on the basis of the magnetic field map. Moreover, the beacon module 55 can be used to identify the entry into the building and hence activate the indoor localization mode.

The determination of the movement direction is described below. The movement direction is a relevant feature which, although it does not facilitate the determination of the position per se, allows other methods to be significantly improved thereby. By way of example, the step identification algorithms presented above cannot be used on their own without a direction information item for determining the position. The direction information item is based on the results of the orientation module 50. The movement direction can be determined by way of the yaw angle of the movement sensor system 20, which is fixedly aligned in relation to the movement direction. By way of example, a smartphone is suitable to this end, said smartphone being held in the movement direction, or else a sensor which is securely attached to the body and which is fixed in relation to the movement direction.

As described above, this yaw angle is determined by a 6D fusion algorithm. The initial reference position may be determined with the aid of the magnetometer apparatus 23. In the undisturbed case, the direction of the measured magnetic field vector in the xy-plane points north. Parallel to the fusion algorithm, there is the determination of an angle by way of the magnetometer apparatus 23. As a result of recording the magnetic field map 31 in advance, the direction of the magnetic field vector or the deviation of the compass at specific positions or regions of the localization space 100 is known.

If the localization algorithm calculates a position, the direction measured by the compass can be corrected provided that an angle correction value for the position is stored in the magnetic field map 31 and the compass deviation is approximately constant in the possible occupancy region.

Here, the possible occupancy region emerges from the current position accuracy. Therefore, the positions of the radio beacon 10 are suitable as correction points, for example. It is expedient to install the radio beacons 10 in regions of the localization space 100 where the compass deviation is as constant as possible. At a correction point, the corrected direction of the magnetic field vector $\tilde{\psi}_{mag}$ is determined from the measured magnetic field direction $\psi_{mag}$ and the correction value $\delta_{mag}$ from the magnetic field map 31.

$$\tilde{\psi}_{mag} = \psi_{mag} - \delta_{mag}.$$

The corrected measurement value serves as a directional reference for the orientation module 50. An offset $\delta_{6D}$ between the yaw angle of the 6D fusion algorithm $\Psi_{ED}$ and the directional reference $\tilde{\psi}_{mag}$ is calculated. This calculation takes place at every correction point $$\delta_{6D} = \psi_{6D} - \tilde{\psi}_{mag}$$

The movement direction then emerges at all times from the yaw angle $\psi_{6D}$ and the most current offset $\delta_{6D}$ $$\tilde{\psi}_{6D} = \psi_{6D} - \delta_{6D}.$$

Moreover, the assumption can be made that, as a rule, the Earth's magnetic field is unperturbed outside of buildings, i.e. outside of the localization space 100. Therefore, each point outside of a building can be used as a correction point. Here, the correction value is zero. In order not to weight brief perturbations of the magnetic field outside of the building or directly in front of a building too strongly, a long-term averaging of the offset $\delta_{6D}$ is expedient. To this end, it is possible, for example, to calculate the sliding mean of the offset with a window size of at least 3 seconds.

Thus, if a user enters a building from the outside, a $\delta_{6D}$ already exists. As soon as the building is entered, this offset remains unchanged up to the next correction point. It is also thus possible to carry out a localization process in a building in which no correction points are present. However, the direction error then increases with time and with the traversed path within the building on account of the yaw angle drift of the 6D fusion algorithm.

Here too, a Gaussian probability distribution with the standard deviation $\sigma_\psi$ is assumed for fusion with other modules. Here, the term $\Psi(r, r')$ describes the angle in Euclidean space between a position r and a previous position r'.

$$P_\Psi(r \mid m, r') = \frac{1}{\sqrt{2\pi}\,\sigma_\Psi} e^{-\frac{1}{2\sigma_\Psi^2}(\Psi(r,r') - \Psi(m))^2} \quad \text{with } \Psi(m) = (\psi')_{6D}.$$

Deterministic fusion options are described below.

Certain individual modules (e.g. orientation module 52, the beacon module 55 and step identification module 51, magnetometer apparatus 23) can be fused to a working overall system without applying probabilistic methods. In practice, a probabilistic fusion is often more suitable as it can take measurement inaccuracies better into account. Nevertheless, the deterministic variant is described below.

By way of example, the first position can be determined by a radio beacon 10 which, for example, is fastened to the entrance door of a building. In theory, the last reliable GPS position can also be used to this end. One of the two step identification modules 51 is mandatory during this simple fusion. The region to be covered is placed into a Cartesian coordinate system. As long as the beacon module 55 reports this position, the current position output is equal to the position of the radio beacon 10.

If a step identification module 51 now, for example, provides a signal about a step event with a stride length, the current coordinate is increased by the stride length. The direction in which this occurs is determined by the direction that is output by the movement direction module 52 at the time of the step. If a foot sensor is used as a step module, this time is the midpoint of the swing phase of the foot on which the foot sensor is fastened. It is likewise possible to average the direction during the entire swing duration.

To the extent that use is intended to be made of the rotationally invariant features, use must be made of a probabilistic filter.

The object of the probabilistic filter is to estimate the conditional probability P(s|m) of the system variable s in relation to the currently given measurement values m of the sensors. By way of example, the system variables are described by the position r or else the orientation o in the vector $s=(r_x, r_y, r_z, o_x, o_y, o_z)$. By way of example, the input data of the filter are the rotationally invariant magnetic features (|B|, $B_n$), the inertial sensor data in the form of the accelerations ($a_x, a_y, a_z$) and the angular speed ($\omega_x, \omega_y, \omega_z$) and the magnetic flux density ($B_x, B_y, B_z$).

The filter can work both on all system variables or else only on a subgroup, such as e.g. the magnetic part of the system with $s=(r_x, r_y, r_z)$ and (|B|, $B_n$).

The state space of the system variables can be continuous or discrete partition of the applicability domain. The discrete case is advantageous in that the conditional probability $P(s_i|m)$ offers an exact solution at the cells i, while the calculation of the conditional probability in the continuous case is only an approximation. The disadvantage of the discrete case lies in the limitation of the accuracy by the cell size. In practice, the resolution is restricted by the quality of the sensors for capturing movement and the magnetic field and by the problem characteristics, and so it is expedient to select a suitable cell size. In this case, the localization space 100, e.g. a two-dimensional space $A \subset \mathbb{R}^2$, is subdivided into cells i with, for example, a fixed cell size. Here, all system variables $s_i$ are specified in the cell i thereof.

Here, as a matter of principle, different filters such as the Kalman filter, the particle filter and a discrete Bayesian filter can be considered. The Kalman filter offers the best solution under the condition that linear system dynamics s(t')=Ds(t)+ξ are present. The system dynamics describe the transition from a system state s(t) at the time t to a new state s(t'), wherein the dynamics D are a linear operator in the form of e.g. a matrix which maps the state vector s to the new state. Here, the system noise must be Gaussian τ~N(0,σ).

A particle filter does not require this assumption but is, however, only an approximation, the accuracy of which increases with an increasing number of particles. For the discrete case, the Bayesian filter is directly usable and exact.

The Bayesian filter uses the law of conditional probabilities, which presents a reformulation of the definition thereof:

$$P(A \mid B) = \frac{P(A \cap B)}{P(B)}.$$

Using this, and the fact that P(A∩B)=P(B∩A), P(A|B)P(B)=P(B|A)P(A) is obtained and hence also the law of conditional probabilities:

$$P(A\mid B) = \frac{P(B\mid A)P(A)}{P(B)}. \quad (1)$$

Applied to the conditional probability P(s|m) of the system variable s in respect of the current measurement values m of the sensors, the following emerges:

$$P(s|m)=cP(m|s)P(s),$$

with the normalization constant $$C = \frac{1}{\sum P(m\mid s)P(s)}.$$

The advantage of this expression lies in its iterative form and the fact that the calculation of the conditional probability P(m|s) of the measured value in a given system state is often more likely to be possible than the determination of P(s|m).

In order to carry out an iteration, the system state $s_t$=s(t) and the measurement $m_t$=m(t) at an iteration step t must be considered. From the law of conditional probabilities (equation (1)) with $$m_{1,t} \approx (m_1, \ldots, m_t),\ A=(s_t|m_{1:t-1}),\ B=(m_t|m_{1:t-1}),$$

the following iteration is obtained:

$$P(s_t|m_{1:t})=CP(m_t|s_t)\Sigma_z P(s_t|s_{t-1}=z)P(s_{t-1}=z|m_{1:t-1}) \quad (2).$$

In a system with Markov dynamics, the transition probabilities $P(s_t|s_{1:t-1})$ of the state transition $s_{t-1} \to s_t$ form a semi group which is expressed by the Chapman-Kolmogorow equation P(s|a)=$\Sigma_z$P(s|z)P(z|a). The iteration expression of the filter emerges:

$$P(s_t|m_{1:t})=CP(m_t|s_t)\Sigma_z P(s_t|s_{t-1}=z)P(s_{t-1}=z|m_{1:t-1}).$$

This calculates the conditional probability distribution $P(s_t|m_{1:t})$ at the time step t from the last distribution $P(s_{t-1}|m_{1:t-1})$ at the time step t−1. The iteration starts at t=1 with $P(s_0|s_{1:0})$=$P(s_0)$. The initial distribution $P(S_0)$ represents information about the system state at the outset. If the initial position is known to be at the position r, for example as a result of radio beacons 10 or else as a result of optical localization information (e.g. markers on a wall), the initial distribution is a delta distribution $P(s_0)=\delta_{s0r}$ or else any other distribution which covers the possible occupancy range. For a completely unknown initial position, the initial distribution is an equal distribution $P(s_0)$=C.

The transition probabilities $P(s_t|s_{t-1})$ characterize the possible movements in the dynamics of the system. For a run on a path network, the possible transitions are given by the adjacent matrix $$G_{ij} = \begin{cases} 0: & \text{not connected} \\ 1: & \text{otherwise} \end{cases}$$

of the graph network with the nodes i, j. If all transitions have equal probability, the transition probabilities are $$P(s_t = i\mid s_{t-1} = j) = \frac{1}{D_j}G_{ij},$$

with the weighting $D_j$=$\Sigma_i G_{ij}$ of the nodes.

The use of rotationally invariant magnetic field features is presented below.

The conditional probability $P(m_t|s_t)$ of the measured value $m_t$ in the case of a given system state $s_t$ at the time step t formulates the information about the expected measurement values when the system is in the known system state. By way of example, the conditional probability $P(m_t|s_t)$ about the information of the magnetic field map 31 $M_i$=(|B|, $B_n$)$_i$, which stores the features (|B|, $B_n$)$_i$ for all cells, is determined for the position state of the system s=($r_x$, $r_y$, $r_z$) and the values of the rotationally invariant features m=(|B|, $B_n$). This has been described above.

If use is made of magnetic features, the expression has the following form $$P(i\mid m_{1:t}) = C\prod_k N(d_{ik}, \sigma_k)\sum_j \frac{1}{D_j}G_{ij}P(j\mid m_{1:t-1})$$

for the iteration step t−1

$$m_{1,t-1})$$

and the cells $b_j$. The normalization of $P(i|m_{1:t})$ is given by the constant C with $$C^{-1} = \sum_i \prod_k N(d_{ik}, \sigma_k)\sum_j \frac{1}{D_j}G_{ij}P(j\mid m_{1:t-1}).$$

As soon as a position can be reliably determined, for example by way of a radio beacon 10, the overall probability $P(i|m_{1:t})$ is set hard, or the system is re-initialized with the beacon position as initial position.

How the step information is introduced into the calculation is described below. If use is made of the expression, described above, for $P(s_t|s_{t-1})$, only the features of the magnetic field and the prior knowledge about adjacent cells are used. In the process, the current dynamics of the system are not also introduced. These dynamics may be captured by the inertial sensors. To this end, the step probability $P_{step}$ is introduced, which was introduced above and which describes precisely these dynamics, wherein the system variables $s_t$ and $s_{t-1}$ correspond to the current position r and the previous position r' of the step identification module 51.

Hence, the transition probability is extended by the addition of the step measurement values.

$$P(S_t|S_{t-1}) \to P_{step}(s_t|s_{t-1},m)=P_{step}(r|r',m)$$

The step probability provides essential information about the transition probability and hence it replaces the adjacent matrix. Ultimately, the following is obtained for the resultant overall probability:

$$P(s_t\mid m_{1:t}) = CP(m_t\mid s_t)\sum_z P_{step}(s_t\mid s_{t-1}=z, m_t)P(s_{t-1}=z\mid m_{1:t-1})$$

-continued $$C^{-1} = \sum_{s_t} P(m_t | s_t) \sum_k P_{step}(s_t | s_{t-1} = z, m_t) P(s_{t-1} = z | m_{1:t-1})$$

In principle, different feature probabilities which do not depend on the previous measurement values may be introduced into $P(m_t|s_t)$. The various individual probabilities of different features with the index k are multiplied. Hence, it is possible to incorporate e.g. map information, traversed path probabilities.

$$P(m_t | s_t) = \prod_k P(m_{k,t} | s_t)$$

An effective possibility of incorporating map information such as obstacles and walls into the fusion lies in adapting the step probability $P_{step}$. If an obstacle is situated between the positions z and $s_t$, then the step probability at this location assumes the value of 0.

The accuracy of the system varies depending on the selected configuration and fusion method. It is composed of the accuracy of the individual modules. The distance error of a foot sensor can be estimated comparatively well. In internal tests, it was between 0.5% and 2% of the traversed path, depending on the user. In realistic test runs, a 6D fusion in relation to the relative yaw angle determination has a drift of, on average, 1.5° per minute.

Thus, for example, on 50 meters in 40 seconds after a radio beacon point 10, an error of approximately 1° and 1 m emerge as a result of a deterministic fusion. However, this assumes that the reference or start position and the angle correction by way of the magnetic field at the radio beacon 10 work in an ideal manner. In practice, a position error of up to 1 m emerges as a result of the radio beacon 10. The directional correction depends strongly on how constant the magnetic field direction is in the correction region. In practical tests in typical office buildings, the correction error, as a rule, lies at ±2°. Thus, 2 m errors in the pure distance and 1.7 m as a result of the incorrect correction of the direction may emerge in a bad case. However, if the map information about possible cell and path connections is added, the overall error, on average, lies at under 1 m.

As a result of a probabilistic fusion of the presented rotationally invariant magnetic field features with the movement direction and a step identification without a foot sensor, accuracies of approximately 1 m also emerge in 1D regions, such as corridors. However, as a result of the assumption of fixed stride lengths, the accuracy depends on how good the parameters are set to the user. Overall, both of the variants evaluated here offer a very high accuracy with minimal installation outlay, as only a few radio beacons 10 need to be used.

Methods based purely on the field strength require a very high number of routers or radio beacons 10 for this level of accuracy. By way of example, for spatially exact locating, commercial methods require about 10 times as many WLAN routers.

An exemplary procedure of an indoor navigation by means of Bluetooth radio beacon 10, foot sensors and the capture of the magnetic field direction by way of determination fusion is explained below.

The magnetic field map 31 of the localization space 100 is measured before a possible localization. Said magnetic field map contains the magnetic field correction values at the positions of the radio beacons 10 in this configuration.

A user wishes to be navigated to a specific point within a distant building. A conventional navigation system navigates them to a building that is equipped with the system as proposed herein. At the entrance, a radio beacon 10 was positioned in such a way that the indoor localization apparatus 1 of the user receives Bluetooth advertisement packets with the beacon ID at a signal strength that exceeds a threshold set in advance. The localization appliance 1 carried by the user ascertains the position that belongs to the radio beacon 10 ID, either by querying a database which is situated either on the localization apparatus 1 or in a remote server, or by virtue of receiving these data with the advertisement packet. In addition to the position, the localization appliance obtains information about the alignment of the magnetic field situated in a close region around the radio beacon 10. The localization apparatus 1 now knows its absolute position and can calculate its alignment by virtue of correcting the magnetic field direction measured thereby in accordance with the correction value from the magnetic field map 31 that is stored for the radio beacon 10. Now the localization apparatus 1 knows its position and alignment under the radio beacon 10. A navigation component can now calculate the path which the user must traverse to their target.

If the user now walks in the direction of this path, the foot sensor wirelessly transmits the direction, in x, y and z, of each step in a length unit to the localization appliance 1. The movement direction module 52 of the smartphone determines the xy-direction in which the step occurred. Away from beacon positions, the movement direction module 52 determines the direction only by measurements of the translation sensors 21 and the rotation sensors 22. By summing the traversed stride lengths, the system is now able to ascertain where the user is situated within the building. Since a small measurement error arises at each step, it is necessary to attach a further radio beacon 10 after a certain path length (e.g. 50 meters), said further radio beacon resetting the position and direction errors again.

FIG. 1 presents a data processing apparatus 30, which is part of the localization apparatus 10. In principle, it is possible for the data processing apparatus to have a local, distributed or decentral embodiment.

Therefore, it is also not mandatory for the orientation module 50, the step identification module 51, the movement direction module 52, the magnetic field map analysis module 53, the module for using rotationally invariant magnetic features and/or the beacon module 55 to be arranged in one unit.

In FIG. 2A, the steps which occur during the calibration for determining the absolute position are carried out, wherein use is made here of a radio beacon 10. In the first step 201, the positions of the radio beacons 10 in the localization space 100 are determined or measured.

In the subsequent step 202, thresholds of the radio waves 11, within which the position of the localization apparatus can be replaced by the position of the radio beacon 10, are determined or set. Alternatively, or additionally, it is also possible to read different position markers 12, such as QR codes, in this case so that absolute positions may be present.

These data are stored in step 203 such that the localization apparatuses 100 may access these during the localization.

FIG. 23 presents how the magnetic field map is created and stored in advance in one embodiment.

Spatial regions, i.e. cells, within which the magnetic data of the Earth's magnetic field are intended to be determined, are set in the localization space 100 in the first step 211. Subsequently, the magnetic field angle is measured in step 212.

This is followed by calculating the deviation from the true Earth's magnetic field angle (step 213).

Alternatively, and additionally, use can also be made of different magnetic properties.

Finally, the determined and calculated values for each cell are stored. In the process, mean values, interpolated values and/or variances are also calculated in certain circumstances. Additionally, or alternatively, it is also possible, in a step 215, to capture rotationally invariant features of the magnetic field and then store these in step 214.

FIG. 3 presents an embodiment of the localization method in the form of a flowchart.

Initial points are the beacon data from the calibration phase (302, FIG. 2A) and the magnetic field map 23 from the calibration phase (301, FIG. 2B).

Different signals are evaluated by the data processing apparatus 30 in steps 303, 305, 306, 307. The radio signal 11 is measured in step 303 and forwarded to the beacon module (step 304). The beacon module 55 makes a decision as to whether the signal strength of the radio signals 11 is sufficiently high to be able to replace the position of the localization apparatus 1 by the position of the radio beacon 10 or a corresponding probability distribution.

The result is stored in a third position data record which provides information about the absolute position in the localization space 100. Alternatively, or additionally, position markers 12 may also be used here.

The movement sensor system 20 comprises a translation sensor 21 and a rotation sensor 22. In the present case, linear accelerations and rotational accelerations are captured by the accelerometer and the gyroscope (steps 305, 306).

These data are transferred to the orientation module 50 in step 308, said orientation module being able to determine the alignment of the sensor system in space. The data are transmitted to the module for determining the movement direction.

The data of the orientation module 50 and of the translation sensor 21 are then transmitted to the step identification module 51 (step 309). Here, a first position data record is provided for the further evaluation.

Further, a magnetometer apparatus 23 serves to capture magnetic details of the Earth's magnetic field in the localization space 100 (step 307). The movement direction always requires orientation data (relative yaw angle).

The magnetometer apparatus data with the magnetic field map 31 are introduced when beacon data are available. The beacon position of the beacon module then specifies the cell or the position in which the required stored data are stored in the magnetic field map.

The movement direction can already be determined (step 311) from the magnetic data, i.e. from the comparison with the magnetic field map 31. The data from the beacon module 55 (step 304) may be used for this determination.

In the embodiment depicted here, use is further made of rotationally invariant features which are determined on the basis of measuring the magnetic raw data by the magnetometer apparatus 23 (step 310). Here, use can be made either of the data from the accelerometer (step 305) or of the data from the orientation module (step 308).

Then, a magnetic field probability is determined in step 312, in this case using the magnetic field map (step 302).

The data from the beacon module 55 (step 304), the step identification module 51 (step 309) and the movement direction module 53 (step 311) and the determination of the magnetic field probability (step 312) are then processed in a probabilistic fusion model (step 350). The calculation of the most probable position has been described above.

This ultimately leads to the output of the position and the direction of the localization apparatus 1 in the localization space 100 (step 351).

In the embodiment presented here, use is made further of a sensor part 24 (step 330, in this case using a foot sensor) which is arranged at an extremity. Here, a translation sensor and a rotation sensor are arranged on the foot of the user (steps 331, 332). The sensors 21, 22 in this case capture the movements of the user.

The foot sensor further comprises a dedicated orientation module (step 333). Ultimately, the data are merged with a stride length estimation (step 334) in a step identification module. These data are transmitted to the fusion module (step 350) in order to improve the probabilistic processing further.

LIST OF REFERENCE SIGNS

1 Localization apparatus
10 Radio beacon
11 Radio signal
12 Position marker
20 Movement sensor system
21 Translation sensor
22 Rotation sensor (gyroscope)
23 Magnetometer apparatus
24 Sensor part at an extremity, foot sensor
30 Data processing apparatus
31 Magnetic field map
40 Means for determining an absolute position of the localization apparatus
41 Radio module
50 Orientation module
51 Step identification module
52 Movement direction module
53 Magnetic field map analysis module
54 Use of rotationally invariant magnetic features
55 Beacon module
100 Localization space
B Magnetic field
n Normalized Earth's gravity vector
α Deviation of the magnetic field from true north

The invention claimed is:

1. A localization apparatus, a position of which in a localization space is determinable, comprising:
a movement sensor system comprising at least one translation sensor and at least one rotation sensor for capturing movement variables that act on the localization apparatus, and
at least one magnetometer apparatus for capturing magnetic field data in the localization space, wherein magnetic features are determinable by means of a data processing apparatus,
a means for determining an absolute position of the localization apparatus in the localization space and
an integrated data processing apparatus or a coupling to the data processing apparatus for calculating a position while processing measurement data of the movement sensor system using a magnetic field map that was stored in advance, having magnetic parameters, of at least parts of the localization space and for processing the determined absolute position,
wherein a probabilistic grid-based Bayesian filter is usable for processing the magnetic features.

2. The localization apparatus as claimed in claim 1, wherein at least one of the at least one translation sensor, the at least one rotation sensor, and the at least one magnetometer apparatus is embodied as a one-axis, two-axis and/or three-axis measuring means.

3. The localization apparatus as claimed in claim 1, wherein the localization apparatus is embodied as a mobile hand-held appliance; or as a portable system for a user.

4. The localization apparatus as claimed in claim 1, wherein the movement sensor system captures a local direction of Earth's gravity field.

5. The localization apparatus as claimed in claim 1, wherein a measured magnetic field vector is projected onto a direction of a local Earth's gravity vector for obtaining the magnetic features.

6. The localization apparatus as claimed in claim 1, wherein the means for determining an absolute position comprises a radio module for receiving wireless signals.

7. The localization apparatus as claimed in claim 6, wherein the wireless signals comprise radio data from a radio beacon in the localization space.

8. The localization apparatus as claimed in claim 1, wherein the means for determining the absolute position comprises an evaluation means for an optical marker.

9. The localization apparatus as claimed in claim 8, wherein the optical marker comprises a QR code.

10. The localization apparatus as claimed in claim 1, wherein at least one sensor part at an extremity of a user captures data about movement variables at the extremity and transfers the data about movement variables to the data processing apparatus.

11. The localization apparatus as claimed in claim 10, wherein the at least one sensor part comprises a foot sensor.

12. The localization apparatus as claimed in claim 1, wherein the position is calculated using the magnetic features.

13. The localization apparatus as claimed in claim 12, wherein the magnetic features are rotationally invariant magnetic features.

14. A method for localizing at least one localization apparatus in a localization space, the method comprising:
a) calculating, by a data processing apparatus, a direction and length of a movement of the at least one localization apparatus, proceeding from an initial position, by way of a translation sensor and a rotation sensor of a movement sensor system for determining a first position data record,
b) calculating a second position data record by evaluating a magnetic field map that was stored in advance and measurement results from at least one magnetometer apparatus wherein a probabilistic grid-based Bayesian filter is used for processing magnetic features,
c) determining a third position data record of the at least one localization apparatus depending on an absolute position in the localization space, and
d) fusing the first position data record, the second position data record and the third position data record, wherein steps a) to c) are carried out once in any sequence.

15. The method as claimed in claim 14, wherein a current position of the at least one localization apparatus is determined depending on a wireless signal, or depending on a position marker, or both.

16. The method as claimed in claim 15, wherein the wireless signal comprises radio waves of a radio beacon or the position marker comprises an optical marker, or both.

17. The method as claimed in claim 14, wherein a current position of the at least one localization apparatus is equated with the absolute position when the at least one localization apparatus is situated within a predetermined distance from the absolute position.

18. The method as claimed in claim 14, wherein at least one sensor part at an extremity of a user captures data about movement variables at the extremity and transfers the data about movement variables to the data processing apparatus.

19. The method as claimed in claim 18, wherein the at least one sensor part comprises a foot sensor.

20. The method as claimed in claim 14, wherein the movement sensor system captures a local direction of Earth's gravity field.

21. The localization apparatus as claimed in claim 1, wherein the movement variables comprise linear accelerations or rotational accelerations, or both.

22. The method as claimed in claim 14, wherein the fusing step is performed by using a statistical method for ascertaining a position of the localization apparatus in a database apparatus.

23. The method of claim 14, wherein the magnetic features are rotationally invariant magnetic features.

* * * * *

UNITED STATES PATENT AND TRADEMARK OFFICE
CERTIFICATE OF CORRECTION

PATENT NO. : 10,584,970 B2
APPLICATION NO. : 15/543403
DATED : March 10, 2020
INVENTOR(S) : Konstantin Klipp et al.

It is certified that error appears in the above-identified patent and that said Letters Patent is hereby corrected as shown below:

In the Claims

Column 23, Line 8, Claim 3, delete "appliance;" and insert -- appliance, --

Column 24, Line 20, Claim 16, delete "beacon" and insert -- beacon, --

Column 24, Lines 37-38, Claim 21, delete "accelerations" and insert -- accelerations, --

Signed and Sealed this
Nineteenth Day of May, 2020

Andrei Iancu
*Director of the United States Patent and Trademark Office*